(12) United States Patent
Nakatani et al.

(10) Patent No.: US 8,952,240 B2
(45) Date of Patent: Feb. 10, 2015

(54) SOLAR CELL MODULE

(75) Inventors: Shihomi Nakatani, Kaizuka (JP); Masaru Hikosaka, Izumisano (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 1150 days.

(21) Appl. No.: 12/169,697

(22) Filed: Jul. 9, 2008

(65) Prior Publication Data

US 2009/0014060 A1    Jan. 15, 2009

(30) Foreign Application Priority Data

Jul. 10, 2007    (JP) .................................. 2007-180978

(51) Int. Cl.
- *H01L 31/048* (2014.01)
- *H01L 31/042* (2014.01)
- *H01L 31/05* (2014.01)

(52) U.S. Cl.
CPC .......... *H01L 31/042* (2013.01); *H01L 31/0485* (2013.01); *H01L 31/048* (2013.01); *H01L 31/05* (2013.01); *Y02E 10/50* (2013.01)
USPC ........................................... 136/251

(58) Field of Classification Search
USPC ......................................................... 136/251
See application file for complete search history.

(56) References Cited

U.S. PATENT DOCUMENTS

| | | | | |
|---|---|---|---|---|
| 5,252,141 A | * | 10/1993 | Inoue et al. | 136/251 |
| 6,288,326 B1 | * | 9/2001 | Hayashi et al. | 136/251 |
| 6,940,008 B2 | * | 9/2005 | Shiotsuka et al. | 136/251 |

FOREIGN PATENT DOCUMENTS

| | | |
|---|---|---|
| JP | 58-137267 A | 8/1983 |
| JP | 03-063954 A | 6/1991 |
| JP | 2000-277780 A | 10/2000 |
| JP | 2001-102616 A | 4/2001 |
| JP | 2002-289894 A | 10/2002 |
| JP | 2002-289895 A | 10/2002 |
| JP | 2004-146697 A | 5/2004 |

* cited by examiner

*Primary Examiner* — Matthew Martin
(74) *Attorney, Agent, or Firm* — Marvin A. Motsenbocker; Mots Law, PLLC

(57) ABSTRACT

A drawing-out opening part and a first insertion slit formed in a back-surface-side sealing body in a direction almost orthogonal to the principal surface of the solar cell module are designed not to overlap each other on a projection plane in parallel to the principal surface of the solar cell module.

15 Claims, 8 Drawing Sheets

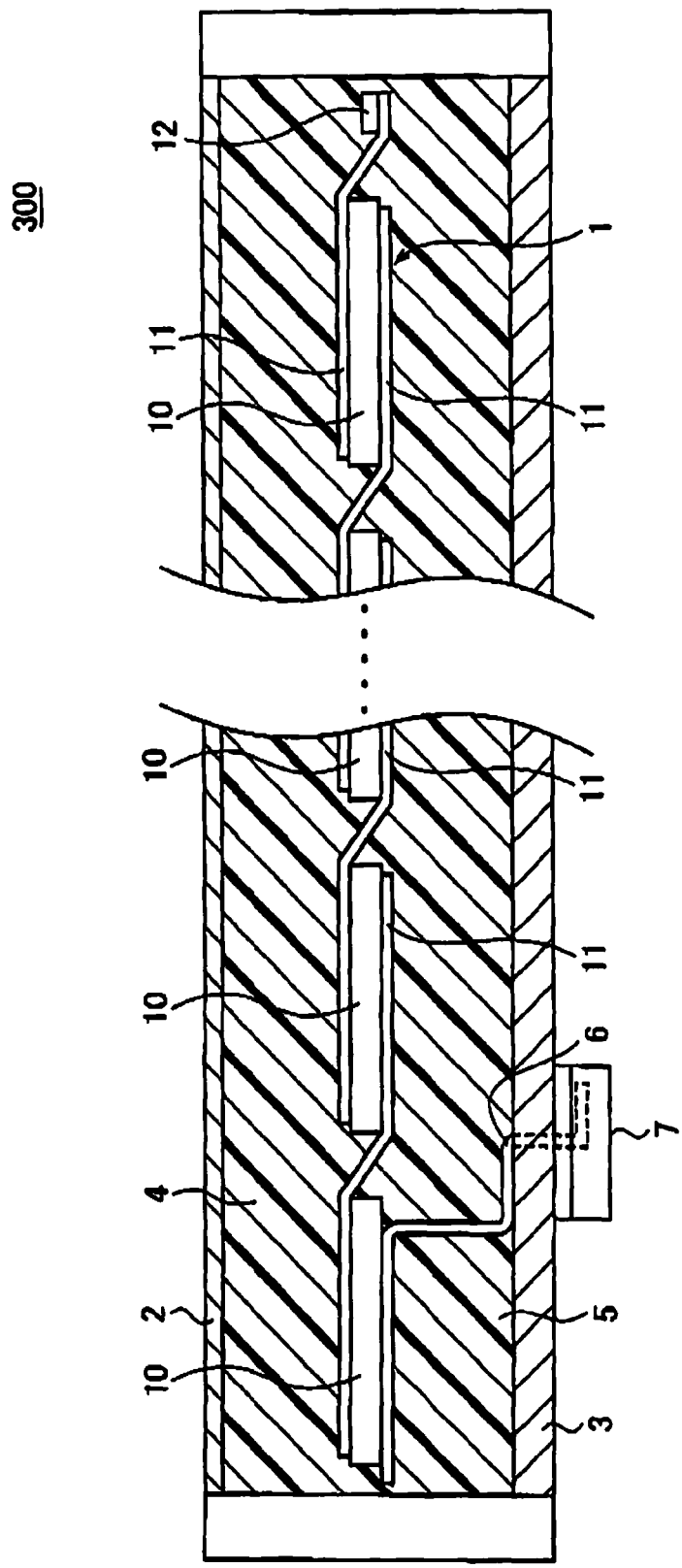

SOLAR CELL MODULE

CROSS REFERENCE TO RELATED APPLICATIONS

This application is based upon and claims the benefit of priority from the prior Japanese Patent Application No. P 2007-180978, filed on Jul. 10, 2007; the entire contents of which are incorporated herein by reference,

BACKGROUND OF THE INVENTION

1. Field of the Invention

The present invention relates to a solar cell module including multiple solar cells and output interconnections through which electric power is outputted from the multiple solar cells.

2. Description of the Related Art

Expectation is placed on the solar cell as a new energy source because the solar cell converts clean, inexhaustibly-supplied sunlight directly into electricity.

Such a solar cell outputs electric power of only several watts. For this reason, as an electric power source for a house, a building, or the like, multiple solar cells are used as being included in a module. The multiple solar cells are sealed in a sealing body between a light-receiving-surface-side protection member and a back-surface-side protection member.

The solar cell module includes output interconnections through which electric power is outputted from the multiple solar cells. The output interconnections are passed straight through the sealing body to a drawing-out opening part provided in the back-surface-side protection member, and are drawn out from the drawing-out opening part to the outside of the solar cell module. See Japanese Patent Application Publication No. Hei. 5-82820, for example.

SUMMARY OF THE INVENTION

A solar cell module according to a first aspect of the present invention has the following gist. The solar cell module includes: multiple solar cells sealed in a sealing body between a light-receiving-surface-side protection member and a back-surface-side protection member; and output interconnections through which electric power is outputted from the multiple solar cells. In the solar cell module, the back-surface-side protection member includes a drawing-out opening part through which the output interconnections are drawn outs each output interconnection is passed through the sealing body from a solar cell included in the multiple solar cells to the drawing-out opening part; the sealing body includes at least one insertion slit through which the output interconnections are passed in a direction almost orthogonal to a principal surface of the solar cell module; and the at least one insertion slit formed in sealing body and the drawing-out opening part do not overlap each other on a projection plane in parallel to the principal surface of the solar cell module.

In the first aspect, because each output interconnection is designed not to be passed straight through the sealing body from its corresponding solar cell to the drawing-out opening part, the output interconnection can be made longer. As a result, when water enters the solar cell module from the drawing-out opening part formed in the back-surface-side protection member, the water can be prevented from reaching the solar cell through the output interconnections.

In addition, because each output interconnection 6 can be formed to bend in the back-surface-side sealing body 5, the entering water is caused to stay in the bent portions of the output interconnection 6.

In the first aspect of the present invention, the sealing body may include an insulating film; and the insertion slit may be formed in the insulating film as well.

In the first aspect of the present invention, the solar cell module may further include a terminal box, arranged on the back-surface-side protection member, for housing the output interconnection; the terminal box may include a drawing-in opening part through which the output interconnections are drawn into the terminal box; and the drawing-in opening part and the drawing-out opening part may overlap each other on the projection plane in parallel to the principal surface of the solar cell module.

BRIEF DESCRIPTION OF THE DRAWINGS

FIG. 8 is a side view of a solar cell module 300 according to the embodiment of the present invention.

DESCRIPTION OF THE PREFERRED EMBODIMENTS

Figure 1:
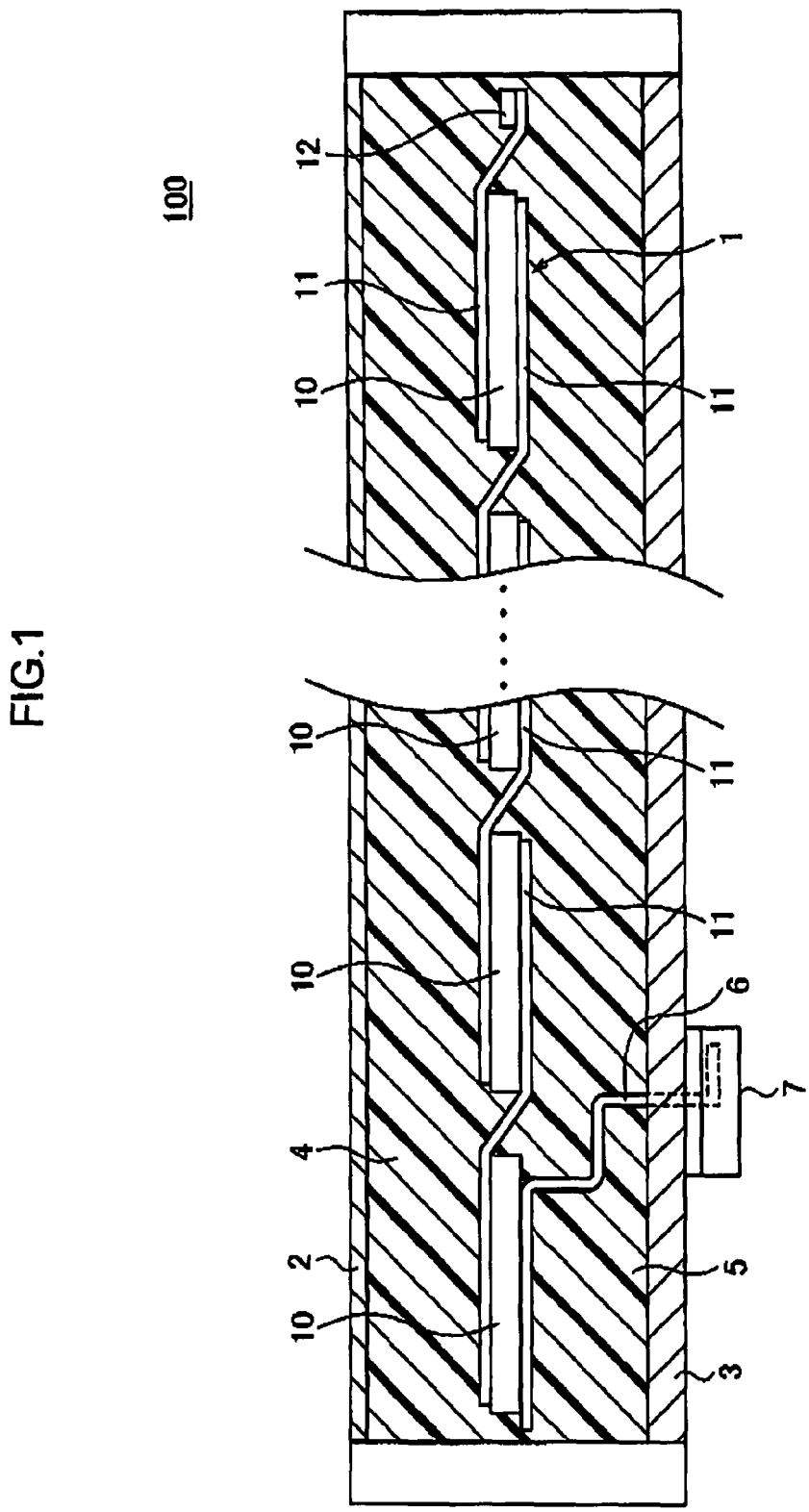
FIG. 1 is a side view of a solar cell module 100 according to an embodiment of the present invention.

Next, descriptions will be provided for the embodiments of the present invention with reference to the drawings. Throughout the drawings, the same or similar component parts are denoted by the same or similar reference numerals. It should be noted that the drawings are just schematic, and that dimensional ratios and the like among component parts are accordingly different from their actual values. For this reason, specific dimensions and the like should be judged with the ensuing descriptions taken into consideration. It goes without saying that dimensional relationships and ratios among the drawings include inconsistent ones.

(Schematic Configuration of Solar Cell Module)

Figure 2:
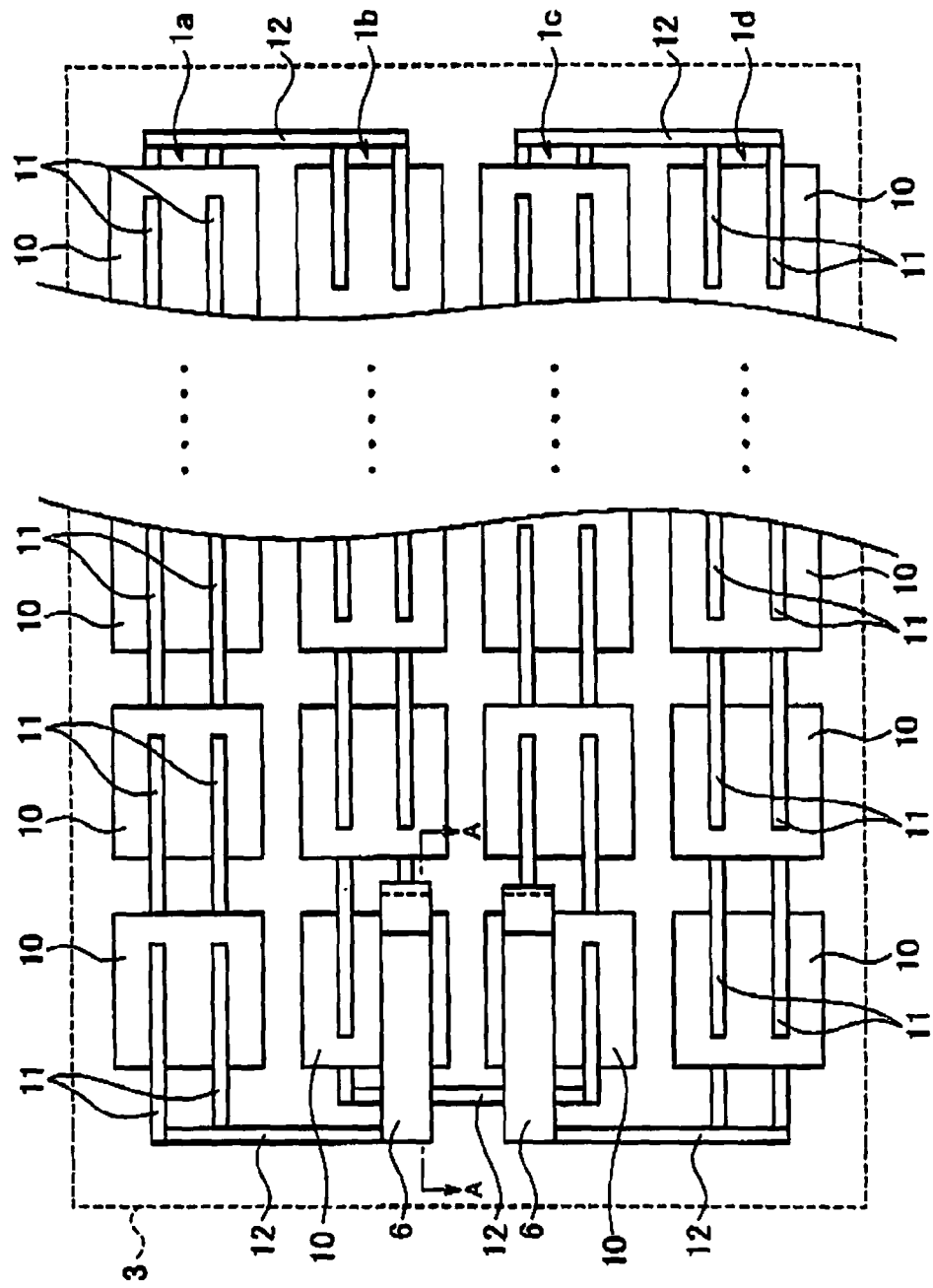
FIG. 2 is a view showing an internal configuration of the solar cell module 100 according to the embodiment of the present invention, which is viewed from the back.
Figure 3:
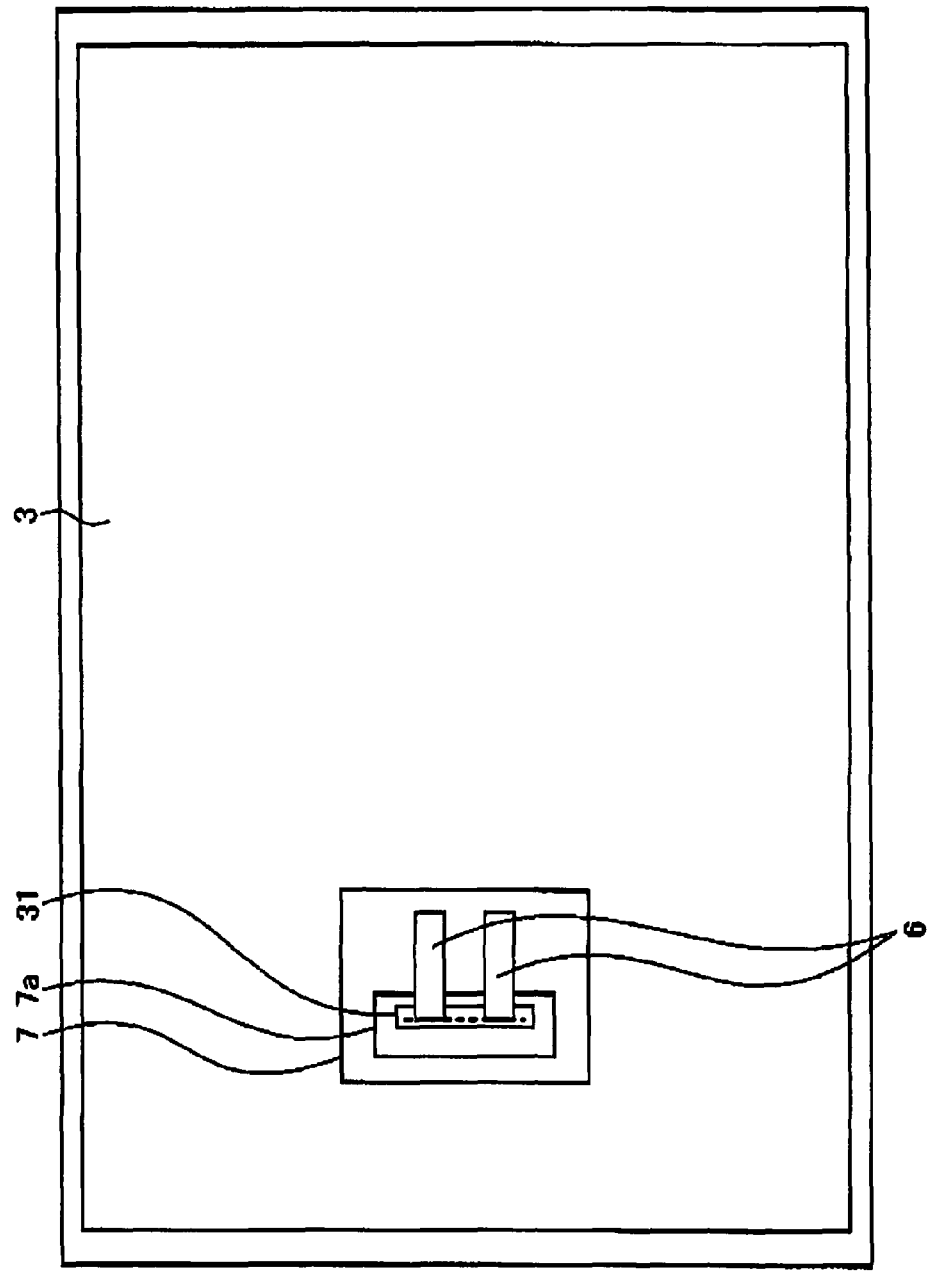
FIG. 3 is a rear view of the solar cell module 100 according to the embodiment of the present invention.

Descriptions will be provided for a schematic configuration of a solar cell module 100 according to an embodiment of the invention by referring to FIGS. 1 to 3. FIG. 1 is a side view of the solar cell module 100 according to the present embodiment. FIG. 2 is a view showing an internal configuration of the solar cell module 100 according to the embodiment of the present invention, which is viewed from the back. FIG. 3 is a rear view of the solar cell module 100 according to the present embodiment. Incidentally, FIG. 3 shows the bottom view of the solar cell module 100 with a cover of a terminal box 7 being detached.

As shown in FIG. 1, the solar cell module 100 includes a solar cell string 1, a light-receiving-surface-side protection member 2, a back-surface-side protection member 3, a light-receiving-surface-side sealing body 4, a back-surface-side sealing body 5, output interconnections 6 and the terminal box 7. The solar cell module 100 is configured by sealing the solar cell string 1 between the light-receiving-surface-side protection member 2 and the back-surface-side protection member 3.

The solar cell string 1 includes multiple solar cells 10 and multiple first interconnection members 11. The solar cell string 1 is so configured that the multiple solar cells 10, which are arranged in the arrangement direction, are electrically connected one to another by use of the multiple first interconnection members 11.

Each solar cell 10 includes: a light receiving surface (the upper surface in FIG. 1) on which sunlight falls incident, a back surface (the lower surface in FIG. 1) provided on the opposite side of the solar cell 10 from the light receiving surface; a photovoltaic converter for generating photogenerated carriers by light incident on the light receiving surface, and paired positive and negative electrodes through which the photogenerated carriers generated by the photovoltaic converter are outputted. One of the paired positive and negative electrodes is formed on the light receiving surface, while the other one is formed on the back surface.

One end of each first interconnection member 11 is connected to the electrode formed on the light receiving surface of a solar cell 10, while its other end is connected to the electrode formed on the back surface of another solar cell 10 next to the solar cell 10. Thereby, any one of the solar cells 10 is electrically connected in series to another solar cell 11 next to the solar cell 10. A sheet-shaped or stranded electrically-conductive material such as copper can be used for the first interconnection members 11. The surface of the electrically-conductive material may be plated with a soft electric conductor (for example, eutectic solder).

In addition, as shown in FIG. 2, each two neighboring solar cell strings 1 are electrically connected to each other in series by use of second interconnection members 12. Like the first interconnection members 11, a sheet-shaped or stranded electrically-conductive material such as copper can be used for the second interconnection members 12, and the surface of the electrically-conductive material may be plated with a soft electric-conductor (for example, eutectic solder).

The light-receiving-surface-side protection member 2 is arranged on the light-receiving side of the light-receiving-surface-side sealing body 4, and thus protects the front surface of the solar cell module 100. Translucent and water-impermeable glass, translucent plastic, and the like may be used for the light-receiving-surface-side protection member 2.

The back-surface-side protection member 3 is arranged on the back side of the back-surface-side sealing body 5, and protects the rear of the solar cell module 100. A resin film made of PET (Polyethylene Terephthalate) or the like, a laminated film having a structure in which a metal foil made of Al or the like is interposed between resin films, and the like can be used as the back-surface-side protection member 3. As shown in FIG. 3, the back-surface-side protection member 3 includes a drawing-out opening part 31 through which the output interconnections 6 are drawn out to the rear of the solar cell module 100.

The light-receiving-surface-side sealing body 4 and the back-surface-side sealing body 5 seal the multiple solar cell strings 1 between the light-receiving-surface-side protection member 2 and the back-surface-side protection member 3. A translucent resin or a sealing structure body can be used for the light-receiving-surface-side sealing body 4 and the back-surface-side sealing body 5. Examples of the translucent resin include EVA, EEA, PVB, silicon, urethane, acryl and epoxy. The sealing structure body is obtained by inserting an insulating film made of PET or the like in one of the above-listed resins. It should be noted that the light-receiving-surface-side sealing body 4 and the back-surface-side sealing body 5 according to the present embodiment are integrally formed by use of EVA.

The output interconnections 6 are interconnection members through which electric power generated by the multiple solar cells 10 is outputted to the outside of the solar cell module 100. Each output interconnect 6 can be formed of a sheet-shaped or stranded electrically-conductive material such as copper. The surface of the electrically-conductive material may be plated with a soft electric conductor (for example, eutectic solder). In addition, it is desirable that the surface of each output interconnection 6 should be coated with an insulating material, or be subjected to an insulation treatment.

An end of each output interconnection 6 is electrically connected to one solar cell 10 included in the multiple solar cells. The output interconnection 6 is inserted through the back-surface-side sealing body 5 from the solar cell 10 to the drawing-out opening part 31. To this end, the back-surface-side sealing body 5 includes insertion slits in which the output interconnection 6 is inserted. Descriptions will be provided later for the positional relationship between the insertion slits and the drawing-out opening part 31. Although not illustrated, an insulating member is inserted between the output interconnection 6 and the solar cell 10. A material which is the same as that used for the back-surface-side sealing body 5, that is EVA, and the like, can be used for the insulating member.

In addition, the other end of the output interconnection 6 is drawn out from the drawing-out opening part 31, and is housed in the terminal box 7. The solar cell module 100 includes paired positive and negative output interconnections 6.

As shown in FIG. 1, the terminal box 7 is arranged on the rear of the solar cell module 100, or on the rear-surface-side protection member 3.

The paired output interconnections 6 drawn out from the drawing-out opening part 31 are drawn into the terminal box 7, as shown in FIGS. 1 and 3. A drawing-in opening part 7a through which the output interconnections 6 are drawn into the terminal box 7 is formed on the bottom surface of the terminal box 7.

As shown in FIG. 3, the drawing-in opening part 7a and the drawing-out opening part 31 overlap each other on a projection plane in parallel to the principal surface of the solar cell module 100.

An Al-made frame may be attached to the outer periphery of the solar cell module 100 having the foregoing configuration.

(Positional Relationship Between Insertion Slits and Drawing-Out Opening Part)

Figure 4:
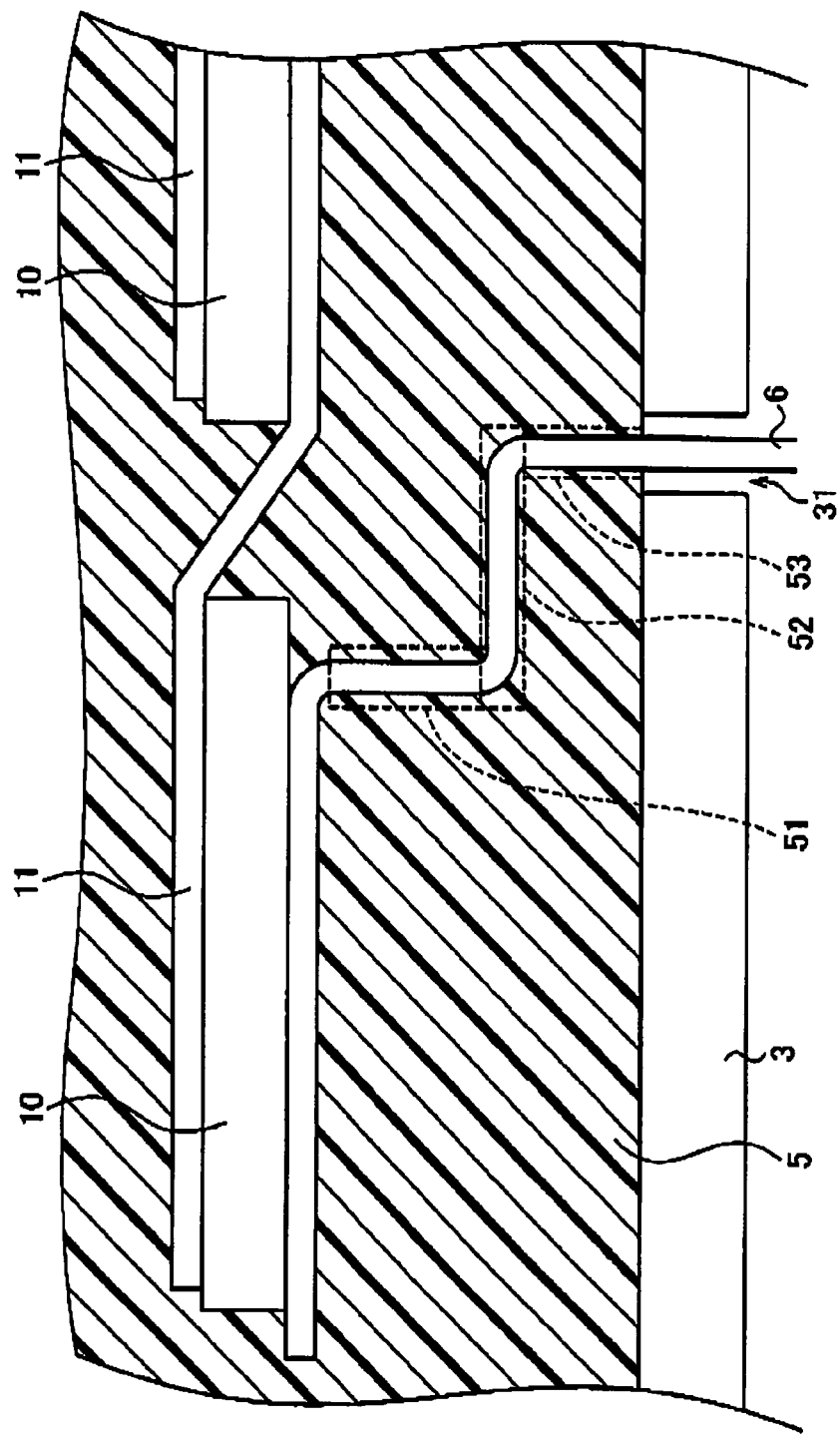
FIG. 4 is a cross-sectional view of the solar cell module 100 taken along the A-A line of FIG. 2.

Next, descriptions will be provided for a positional relationship between the insertion slits formed in the back-surface-side sealing body 5 and the drawing-out opening part 31 by referring to FIG. 4. FIG. 4 is a cross-sectional view of the inner structure of the solar cell module 100, taken along the A-A line of FIG. 2.

As shown in FIG. 4, a first insertion slit 51, a second insertion slit 52 and a third insertion slit 53 are formed in the back-surface-side sealing body 5. Each output interconnection 6 is inserted in the first to third insertion slits 51 to 53.

The first insertion slit 51 is formed in a direction almost orthogonal to the principal surface of the solar cell module 100. The first insertion slit 51 communicates with the second insertion alit 52.

The second insertion slit 52 is formed in an arrangement direction in which the multiple solar cells 10 included in each solar cell string 1 are arranged. The second insertion slit 52 communicates with the third insertion slit 53. As a result, the second insertion slit 52 communicates with both the first insertion slit 51 and the third insertion slit 53.

The third insertion slit 53 is formed in a direction almost orthogonal to the principal surface of the solar cell module 100. The third insertion slit 53 communicates with the drawing-out opening part 31. As a result, the third insertion slit 53 communicates with both the second insertion slit 52 and the drawing-out opening part 31.

As described above, the first to third insertion slits 51 to 53 communicates one with another while the slits as a whole make curves in a crank shape. As a result, each output interconnection 6 includes bent portions at each of which the output interconnection 6 changes direction to form a curve.

In this respect, the drawing-out opening part 31 and the first insertion slit 51 do not overlap each other on the projection plane in parallel to the principal surface of the solar cell module 100. In other words, in the case of the present embodiment, the first insertion slit 51 is formed in a location set off, in the arrangement direction of the solar cells 10, from a location where the drawing-out opening part 31 is formed.

(Method of Manufacturing a Solar Cell Module)

Figure 5:
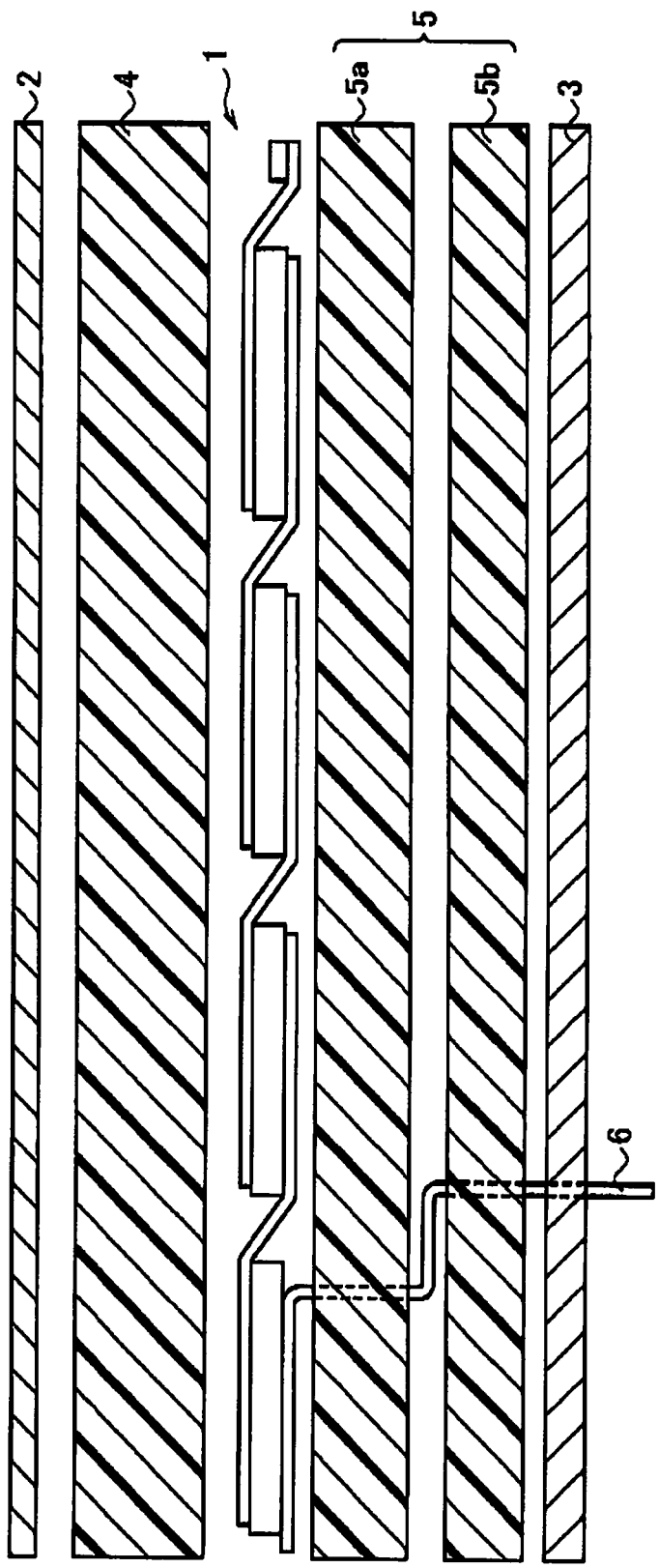
FIG. 5 is a cross-sectional view of components which are going to be assembled into the solar cell module 100 according to the embodiment of the present invention.

Next, descriptions will be provided for a method of manufacturing a solar cell module 100 by referring to FIG. 5. FIG. 5 is an exploded cross-sectional view showing components which are going to be assembled into the solar cell module 100.

First of all, the first interconnection members 11 are electrically connected to the multiple solar cells 10 in such a way that an end of each first interconnection member 11 is connected to the light receiving surface of a solar cell 10 while its other end is connected to the rear surface of a neighboring solar cell 10. Thereby, the solar cell strings 1 are formed. Subsequently, the multiple solar cell strings 1 are electrically connected to each other by use of the second interconnection members 12.

Thereafter, the output interconnections 6 are electrically connected respectively to solar cells 10 located at one ends of two neighboring strings 1.

After that, two EVA sheets (that is, a first back-surface-side sealing member 5a and a second back-surface-side sealing member 5b) constituting the back-surface-side sealing body 5 are prepared. Cuts are made in the respective EVA sheets in their thickness direction in such a way that the cuts are set off away from each other in the arrangement direction of the solar cells 10. In addition, a PET sheet (or the back-surface-side protection member 3) including the drawing-out opening part 31 is prepared. The drawing-out opening part 31 and the cut made in the second back-surface-side sealing member 5b are then aligned to each other in the arrangement direction of the solar cells 10.

Thereafter, each output interconnection 6 is passed through the cuts respectively made in the first back-surface-side sealing member 5a and the second back-surface-side sealing member 5b as well as the drawing-out opening part 31 while changing direction to form curves, and is eventually drawn out from the PET sheet (or the back-surface-side protection member 3).

After that, as shown in FIG. 5, an EVA sheet (or the light-receiving-surface-side sealing body 4), the multiple solar cell strings 1, another EVA sheet (or the first back-surface-side sealing member 5a), the other EVA sheet (or the second back-surface-side sealing member 5b) and the PET sheet (or the back-surface-side protection member 3) are laminated in this order onto the glass substrate (or the light-receiving-surface-side protection member 2). Thereby, a laminated body is completed.

Thereafter, the layers in the laminated body are provisionally bonded together by heating compression bonding in vacuum. After that, the resultant laminated body is heated under a predetermined condition. Thereby, the EVA sheets (that is, the light-receiving-surface-side sealing body 4 and the back-surface-side sealing body 5) melt, and thereafter harden completely. As a result, each output interconnection 6 is embedded in the EVA sheets (or the back-surface-side sealing body 5), and the first to third insertion slits 51 to 53 are formed in the EVA sheets (or the back-surface-side sealing body 5).

Subsequently, each output interconnection 6 drawn out from the PET sheet (or the back-surface-side protecting body 3) is housed in the terminal box 7.

Through the foregoing steps, the solar cell module 100 is manufactured. It should be noted that an Al-made frame may be attached to the solar cell module 100.

(Operation/Working-Effect)

In the case of the solar cell module 100 according to the present embodiment, the drawing-out opening part 31 formed in the back-surface-side protection member 3 and the first insertion alit 51 formed in the back-surface-side sealing body 5 in the direction almost orthogonal to the principal surface of the solar cell module 100 do not overlap each other on the projection plane in parallel to the principal surface of the solar cell module 100.

Accordingly, none of the output interconnections 6 are passed straight through the back-surface-side sealing body 5 from their corresponding solar cells 10 to the drawing-out opening part 31. For this reason, the output interconnections 6 can be longer than output interconnections 6 which would otherwise be passed straight therethrough. As a result, when water enters the solar cell module 100 from the drawing-out opening part 31 formed in the back-surface-side protection member 3, the longer length of the output interconnections 6 makes it possible to prevent the water from reaching the solar cell 10 through the output interconnections 6.

In addition, because each output interconnection 6 can be formed to bend in the back-surface-side sealing body 5, the entering water is caused to stay in the bent portions of the output interconnection 6.

Furthermore, in the case of the present embodiment, the drawing-in opening part 7a and the drawing-out opening part 31, which are formed in the terminal box 7, overlap each other on the projection plane in parallel to the principal surface of the solar cell module 100.

This overlap makes it easy to align the drawing-in opening part 7a and the drawing-out opening part 31 to each other when the terminal box 7 is arranged on the back-surface-side protection member 3.

(Modification of the Present Invention)

Figure 6:
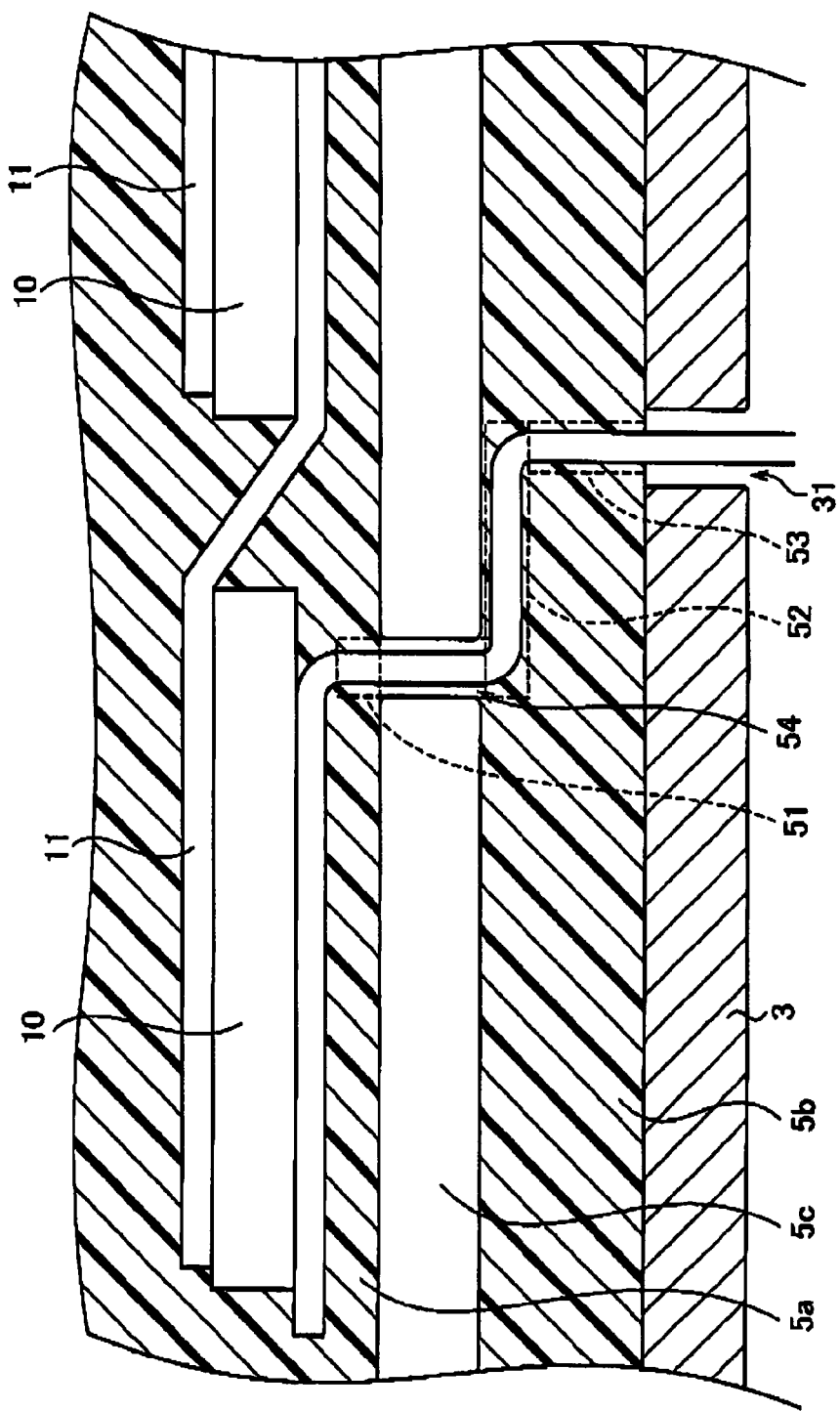
FIG. 6 is a cross-sectional view of a solar cell module 200 according to the embodiment of the present invention.

Next, descriptions will be provided for a modification example of the present embodiment by referring to FIG. 6. FIG. 6 is a side view of a solar cell module 200 according to the present modification.

What makes the present modification example different from the foregoing embodiment is that the modification example employs, as the back-surface-side sealing body 5, a sealing structure body obtained by inserting an insulating film between the resin layers.

As shown in FIG. 6, the back-surface-side sealing body 5 is configured of the first back-surface-side sealing member 5a, the second back-surface-side sealing member 5b and a third back-surface-side sealing member 5c.

A translucent resin, such as EVA, EEA, PVB, silicon, urethane, acryl and epoxy, can be used for the first back-surface-side sealing member 5a and the second back-surface-side sealing member 5b.

An insulating film made of PET or the like can be used for the third back-surface-side sealing member 5c. As a result, the third back-surface-side sealing member 5c does not melt when the laminated body is heated during the module manufacturing process.

It should be noted that a higher dielectric breakdown voltage of the back-surface-side sealing body 5 can be obtained by using, as the back-surface-side sealing body 5, the sealing structure body obtained by inserting the insulating film between the resin layers in such a way that the insulating film covers an area where the solar cells 10 are arranged. As a result, even in a case where a laminated film having a structure where a metal foil is interposed between resin films is used as the back-surface-side protection member 3, it is possible to secure the insulation between the solar cells 10 and the back-surface-side protection member 3.

As shown in FIG. 6, the first insertion slit 51, a fourth insertion slit 54, the second insertion slit 52 and the third insertion slit 53 are formed in the back-surface-side sealing body 5. The output interconnection 6 is passed through the first to fourth insertion slits 51 to 54.

The first insertion slit 51 is formed in the first back-surface-side sealing member 5a in the direction almost orthogonal to the principal surface of the solar cell module 200. The first insertion slit 51 communicates with the fourth insertion slit 54.

The fourth insertion slit 54 is formed in the third back-surface-side sealing member 5c in the direction almost orthogonal to the principal surface of the solar cell module 200. The fourth insertion slit 54 communicates with the second insertion slit 52. As a result, the fourth insertion slit 54 communicates with both the first insertion slit 51 and the second insertion slit 52.

The second insertion slit 52 is formed in the second back-surface-side sealing member 5b in the arrangement direction in which the multiple solar cells 10 included in each solar cell string 1 are arranged. The second insertion slit 52 communicates with the third insertion slit 53. As a result, the second insertion slit 52 communicates with both the fourth insertion slit 54 and the third insertion slit 53.

The third insertion slit 53 is formed in the second back-surface-side sealing member 5b in the direction almost orthogonal to the principal surface of the solar cell module 200. The third insertion slit 53 communicates with the drawing-out opening part 31 formed in the back-surface-side protection member 3. As a result, the third insertion slit 53 communicates with both the second insertion slit 52 and the drawing-out opening part 31.

In this respect, the drawing-out opening part 31 and the fourth insertion slit 54 do not overlap each other on the projection plane in parallel to the principal surface of the solar cell module. In other words, in the case of the present modified example, the fourth insertion slit 54 is formed in a location set off, in the arrangement direction of the solar cells 10, from a location where the drawing-out opening part 31 is formed.

(Method of Manufacturing a Solar Cell Module)

Figure 7:
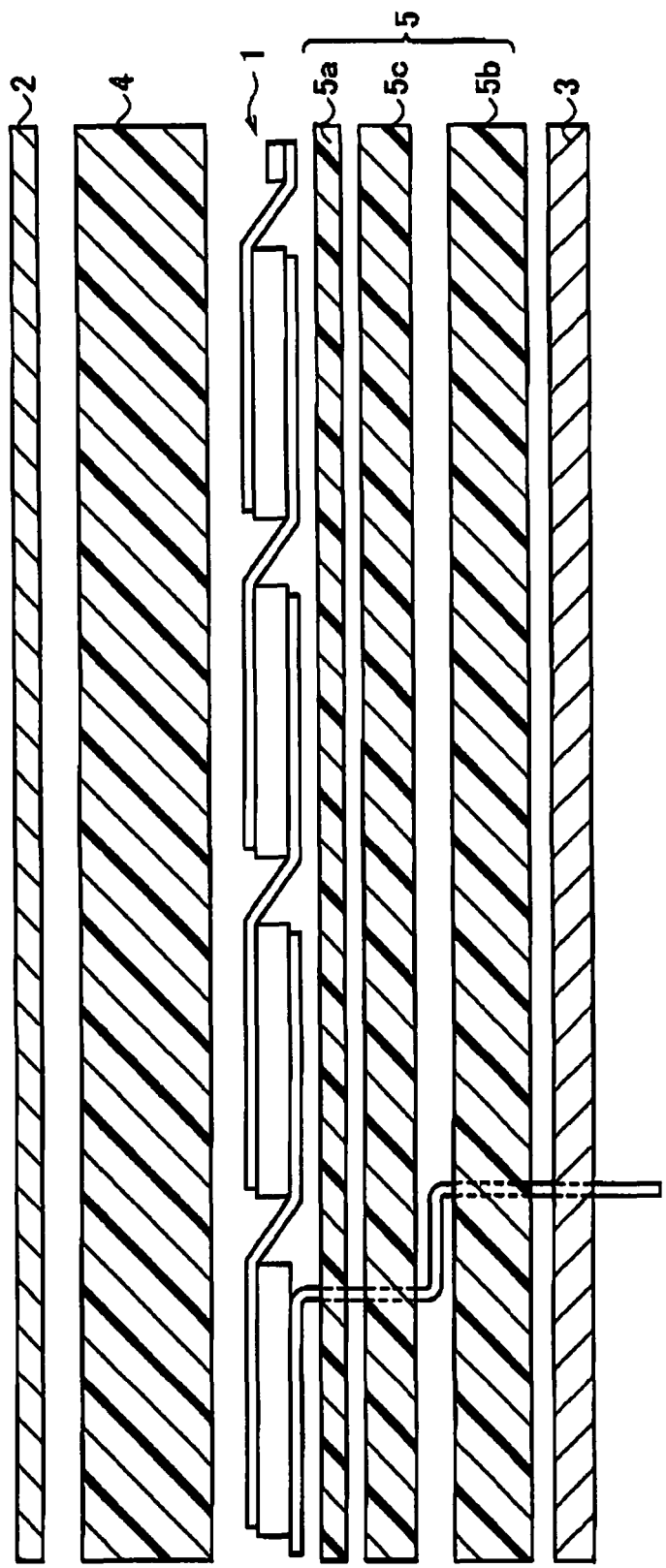
FIG. 7 is a cross-sectional view of components which are going to be assembled into the solar cell module 200 according to the embodiment of the present invention.

Next, descriptions will be provided for a method of manufacturing the solar cell module 200. FIG. 7 is an exploded cross-sectional view showing components which are going to be assembled into the solar cell module 200.

First of all, the first interconnection members 11 are electrically connected to the multiple solar cells 10 in such a way that an end of each first interconnection member 11 is connected to the light receiving surface of a solar cell 10 while its other end is connected to the rear surface of a neighboring solar cell 10. Thereby, the solar cell strings 1 are formed. Subsequently, the multiple solar cell strings 1 are electrically connected to each other by use of the second interconnection members 12.

Thereafter, the output interconnections 6 are electrically connected respectively to the solar cells 10 located at one ends of two neighboring strings 1.

After that, the back-surface-side sealing body 5 with an insulating film (or the third back-surface-side sealing member 5c) being interposed between two EVA sheets (that is, the first back-surface-side sealing member 5a and the second back-surface-side sealing member 5b) is prepared. Cuts are respectively made in the following manner in the two EVA sheets and the insulating film in their thickness directions. Specifically, the cut in an EVA sheet (or the first back-surface-side sealing member 5a) contiguous with the solar cell strings 1 and the cut in the insulating film are formed to be placed at the same position as each other in the arrangement direction of the solar cells 10. Concurrently, the other cut made in the other EVA sheet (or the second back-surface-side sealing member 5b) contiguous with the back-surface-side protection member 3 is formed so as to be set off away from the two cuts in the arrangement direction of the solar cells 10. In addition, a PET sheet (or the back-surface-side protection member 3) including the drawing-out opening part 31 is prepared. The drawing-out opening part 31 and the cut made in the second back-surface-side sealing member 5b are then aligned to each other in the arrangement direction of the solar cells 10.

Thereafter, each output interconnection 6 is passed through the cuts respectively made in the first back-surface-side sealing member 5a, the second back-surface-side sealing member 5b and the third back-surface-side sealing member 5c, and is eventually drawn out from the drawing-out opening part 31.

After that, as shown in FIG. 7, an EVA sheet (or the light-receiving-surface-side sealing body 4), the multiple solar cell strings 1, the sealing structure body (or the first back-surface-side sealing member 5a, the second back-surface-side sealing member 5b and the third back-surface-side sealing member 5c) and the PET sheet (or the back-surface-side protection member 3) are laminated in this order onto a glass substrate (or the light-receiving-surface-side protection member 2). Thereby, a laminated body is completed.

Subsequently, the layers in the laminated body are provisionally bonded together by heating compression bonding in vacuum. After that, the resultant laminated body is heated under a predetermined condition. Thereby, the EVA sheets (that is, the light-receiving-surface-side sealing body 4, the first back-surface-side sealing member 5a and the second back-surface-side sealing member 5b) melt, and thereafter harden completely. As a result, each output interconnection 6 is embedded in the back-surface-side sealing body 5, and the first to fourth insertion slits 51 to 54 are formed in the back-surface-side sealing body 5.

Subsequently, each output interconnection 6 drawn out from the PET sheet (or the back-surface-side protecting body 3) is housed in the terminal box 7.

Through the foregoing steps, the solar cell module 200 is manufactured. It should be noted that an Al-made frame may be attached to the solar cell module 200.

(Operation/Working-Effect)

The insulating film does not melt when the laminated body is heated in the module manufacturing process. In other words, even after the module manufacturing process, the cut made in the insulating film for the output interconnection 6 to pass therethrough continues to remain in the fourth insertion slit 54, in the way it was before the module manufacturing process. As a result, the insertion slit 54 allows water to pass through itself more easily than the first to third insertion slits 51 to 53.

In the case of the solar cell module 200 according to the present embodiment, the sealing structure body obtained by inserting the insulating film (or the third back-surface-side sealing member 5c) between the resin films (or the first back-surface-side sealing member 5a and the second back-surface-side sealing member 5b) is used as the back-surface-side sealing body 5. The fourth insertion slit 54 formed in the insulating film and the drawing-out opening part 31 do not overlap each other on the projection plane in parallel to the principal surface of the solar cell module 200.

For this reason, the distance between the fourth insertion slit 54 and the drawing-out opening part 31 can be made longer. As a result, water can be prevented from reaching the fourth insertion alit 54 which allows water to pass through itself more easily than the first to third insertion slits 51 to 53.

(Other Embodiments)

The present invention has been described on the basis of the foregoing embodiments. However, the descriptions and drawings constituting the disclosure of the present invention shall not be construed as limiting the scope of the present invention. From this disclosure, various alternative embodiments, examples and applied technologies will be clear to those skilled in the art.

In the foregoing embodiment, the back-surface-side sealing body 5 is designed to include the multiple insertion slits which are formed in the direction almost orthogonal to the principal surface of the solar cell module. However, the same effect as the present invention can be brought about even in a case where, as shown in FIG. 8 for example, the back-surface-side sealing body 5 is designed to include only a single insertion slit which is formed in the direction almost orthogonal to the principal surface of the solar cell module.

Furthermore, in the foregoing embodiments, the drawing-out opening part 31 and the first insertion slit 51 are designed to be set off away from each other in the arrangement direction of the solar cells 10. However, as long as the drawing-out opening part 31 and the first insertion slit 51 do not overlap each other on the projection plane in parallel to the principal surface of the solar cell module, the same effect as the present invention can be brought about.

Moreover, in the case of the foregoing embodiments, both the light-receiving-surface-side sealing body 4 and the back-surface-side sealing body 5 are integrally formed by use of EVA. However, different resins may be used for the respective two sealing bodies 4 and 5. Otherwise, the back-surface-side sealing body 5 may be formed by use of multiple different resins.

Additionally, the foregoing descriptions have been provided for the embodiments each in which the output interconnections 6 are designed to be bent twice in the back-surface-side sealing body 5. As the back-surface-side sealing body 5 is designed to be formed with a larger number of layers, the output interconnections 6 can be bent a larger number of times.

It goes without saying that, as described above, the present invention includes various embodiments and the like which have not been described. With this taken into consideration, the technical scope of the present invention shall be defined only by the matters to define the invention concerning the scope of claims which are considered as being adequate from the foregoing descriptions.

What is claimed is:

1. A solar cell module comprising:
a light-receiving-side protection member
a back-surface-side protection member including a drawing-out opening part
a sealing body which includes at least one insertion slit, and comprising a sealing structure body obtained by an insulating film between resin layers, wherein the sealing body includes at least one insertion slit which and the drawing-out opening part do not overlap each other on a protection plane in parallel to the principal surface of the solar cell module,
a plurality of solar cells sealed in the sealing body between the light-receiving-surface-side protection member and the back-surface-side protection member; and
an output interconnection through which electric power is outputted from the plurality of solar cells, the output interconnection includes a first region in which the output connection is through the at least one insertion slit, a second region in which the output connection is through the drawing-out part, and a third region in which the output connection is along an interface between the sealing body and the insulating film.

2. The solar cell module according to claim 1, further comprising a terminal box, arranged on the back-surface-side protection member, for housing the output interconnection, wherein
the terminal box includes a drawing-in opening part through which the output interconnection is drawn into the terminal box, and
the drawing-in opening part and the drawing-out opening part overlap each other on the projection plane in parallel to the principal surface of the solar cell module.

3. The solar cell module according to claim 1, wherein the plurality of solar cells are embedded in the resin layers.

4. A solar cell module comprising:
a light-receiving-side protection member
a back-surface-side protection member including a drawing-out opening part
a sealing body that includes at least one insertion slit which insertion slit and the drawing-out opening part do not overlap each other on a protection plane in parallel to the principal surface of the solar cell module,
a plurality of solar cells sealed in the sealing body between the light-receiving-surface-side protection member and the back-surface-side protection member; and
an output interconnection through which electric power is outputted from the plurality of solar cells, the output interconnection includes a first region in which the output connection is through the at least one insertion slit, a second region in which the output connection is through the drawing-out part, and a third region in which the output connection is along an interface between the sealing body and the back-surface-side protection member.

5. The solar cell module according to claim 4, wherein the sealing body consists of multiple members.

6. The solar cell module according to claim 4, wherein the sealing body includes an insulating film.

7. A solar cell module comprising:
a light-receiving-side protection member
a back-surface-side protection member including a drawing-out opening part
a sealing body which comprises an insertion slit that is positioned without overlap with the drawing-out opening on a protection plane parallel to the principal surface of the solar cell module, a plurality of solar cells sealed in the sealing body between the light-receiving-surface-side protection member and the back-surface-side protection member; and two output interconnections, each formed in a crank shape, through which electric power is outputted from the plurality of solar cells, wherein each output interconnection comprises a first region of the insertion slit, a second region of the drawing-out part, and a third region located between the first and second regions along an interface between the sealing body and the back-surface-side protection member, and wherein the first and second regions are formed in a direction almost orthogonal to the principal surface of the solar cell module.

8. The solar cell module according to claim 7, wherein the sealing body consists of multiple members.

9. The solar cell module according to claim 8, wherein the sealing body includes an insulating film.

10. The solar cell module according to claim 7, wherein the third region is parallel to the principal surface of the solar cell module.

11. The solar cell module according to claim 9, wherein the insulating film is sandwiched between resin layers, has a higher melting temperature than the resin layers and wherein the resin layers but not the insulating layer have been melted around the output interconnection.

12. The solar cell module of claim 7, wherein the third region is adjacent to and touching the back-side protection member.

13. The solar cell module of claim 9, wherein the third region extends along an interface between two resin layers.

14. The solar cell module according to claim 7, further comprising a terminal box, arranged on the back-surface-side protection member, for housing the two output interconnections, wherein the terminal box includes a drawing-in opening part through which the output interconnections are drawn into the terminal box, and the drawing-in opening part and the drawing-out opening part for each output interconnection overlap each other on the projection plane in parallel to the principal surface of the solar cell module.

15. The solar cell module according to claim 7, wherein the sealing body comprises resin surrounding the third region and the resin has been melted around the third region.

* * * * *